(12) United States Patent
Brunnbauer et al.

(10) Patent No.: US 8,076,784 B2
(45) Date of Patent: Dec. 13, 2011

(54) STACKED SEMICONDUCTOR CHIPS

(75) Inventors: Markus Brunnbauer, Lappersdorf (DE); Recai Sezi, Roettenbach (DE); Thorsten Meyer, Regensburg (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/904,561

(22) Filed: Oct. 14, 2010

(65) Prior Publication Data
US 2011/0024918 A1  Feb. 3, 2011

Related U.S. Application Data

(62) Division of application No. 11/859,329, filed on Sep. 21, 2007, now Pat. No. 7,867,878.

(51) Int. Cl.
*H01L 23/48* (2006.01)
(52) U.S. Cl. ............ 257/778; 257/686; 257/E25.006
(58) Field of Classification Search .......... 257/686, 257/777, 778, E25.006, E25.013
See application file for complete search history.

(56) References Cited

U.S. PATENT DOCUMENTS

| | | | |
|---|---|---|---|
| 5,517,057 A | 5/1996 | Beilstein, Jr. et al. | |
| 6,830,956 B2 | 12/2004 | Masumoto et al. | |
| 6,872,598 B2 | 3/2005 | Liu | |
| 6,984,885 B1 * | 1/2006 | Harada et al. | 257/696 |
| 7,141,487 B2 | 11/2006 | Periasamy et al. | |
| 2003/0080410 A1 * | 5/2003 | Shibata | 257/700 |
| 2003/0089973 A1 | 5/2003 | Miyasaka | |
| 2004/0056344 A1 | 3/2004 | Ogawa et al. | |
| 2006/0220261 A1 * | 10/2006 | Egawa | 257/778 |
| 2007/0278657 A1 * | 12/2007 | Lee | 257/692 |
| 2009/0065950 A1 * | 3/2009 | Lee et al. | 257/777 |
| 2009/0149023 A1 | 6/2009 | Koyanagi | |

* cited by examiner

*Primary Examiner* — Thanhha Pham
(74) *Attorney, Agent, or Firm* — Dicke, Billig & Czaja, PLLC

(57) ABSTRACT

Stacked semiconductor chips are disclosed. One embodiment provides a method including a first substrate having a first surface and an opposing second surface. The first substrate includes an array of first connection elements on the first surface of the first substrate. A second substrate has a first surface and an opposing second surface. The second substrate includes an array of second connection elements on the first surface of the second substrate. The first connection elements is attached to the second connection elements; and is thinning at least one of the first substrate and the second substrate after the attachment of the first connection elements to the second connection elements.

18 Claims, 7 Drawing Sheets

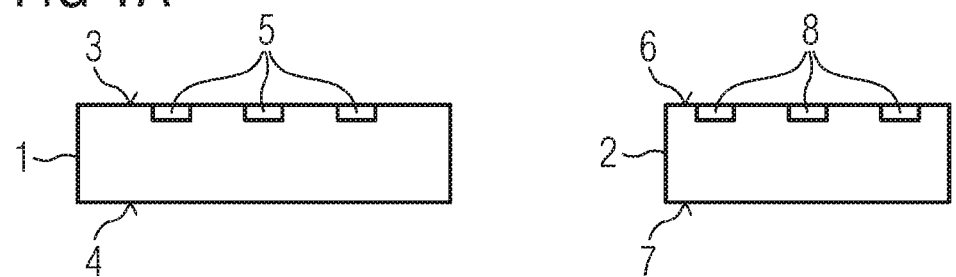
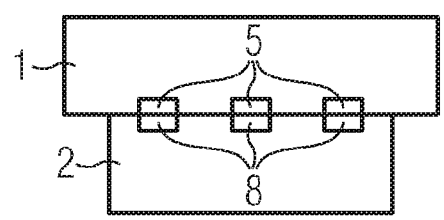
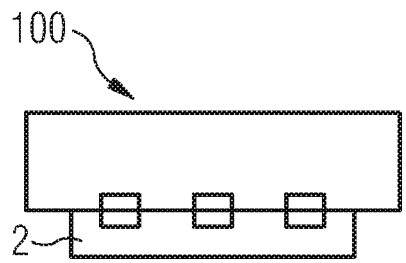

STACKED SEMICONDUCTOR CHIPS

CROSS-REFERENCE TO RELATED APPLICATIONS

This Utility patent application is a divisional application of U.S. application Ser. No. 11/859,329, filed Sep. 21, 2007, which is incorporated herein by reference.

BACKGROUND

This invention relates to devices including stacked semiconductor chips and methods to make a device including stacked semiconductor chips.

For high system integration it is useful to stack integrated circuits, sensors, micromechanical apparatuses or other components on top of each other. The more components are stacked on top of each other, the more the thickness of the stack increases. In some applications, the maximum thickness of the stack may be restricted.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1C schematically illustrate a method to produce a device 100 as an exemplary embodiment.

DETAILED DESCRIPTION

Figure 2A:
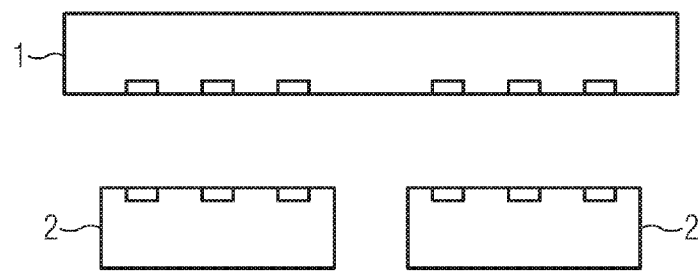
FIGS. 2A to 2D schematically illustrate a method to produce devices 200 as a further exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have connection elements which allow electrical contact to be made with the semiconductor chips. The connection elements may be composed of any desired electrically conductive material, for example, of a metal, such as aluminum, nickel, palladium, gold or copper, a metal alloy, a metal stack or an electrically conductive organic material. The connection elements may be implemented as contact pads. The connection elements may be situated on the active main surfaces of the semiconductor chips or on other surfaces of the semiconductor chips. The active or passive structures of the semiconductor chips are usually arranged below the active main surfaces and can be electrically contacted via the connection elements.

One or more electrically conductive layers may be applied to the semiconductor chips. The electrically conductive layers may be used as wiring layers to make electrical contact with the semiconductor chips from outside the devices or to make electrical contact with other semiconductor chips and/or components contained in the devices. The electrically conductive layers may be manufactured with any desired geometric shape and any desired material composition. The electrically conductive layers may, for example, be composed of conductor tracks, but may also be in the form of a layer covering an area. Any desired electrically conductive materials, such as metals, for example, aluminum, nickel, palladium, silver, tin, gold or copper, metal alloys, metal stacks or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between dielectric layers.

The devices described in the following may include a mold material covering at least parts of the semiconductor chips. The mold material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

FIGS. 1A to 1C schematically illustrate a method for production of a device 100, which is illustrated in cross section in FIG. 1C. As illustrated in FIG. 1A, a first substrate 1 and a second substrate 2 are provided. The first substrate 1 has a first surface 3 and an opposing second surface 4. An array of first connection elements 5 is arranged on the first surface 3 of the first substrate 1. The second substrate 2 has a first surface 6 and an opposing second surface 7. An array of second connection elements 8 is arranged on the first surface 6 of the second substrate 2. Although in FIG. 1A three of the first connection elements 5 and three of the second connection elements 8 are illustrated, the arrays of the first and second connection elements 5 and 8 may include any number of connection elements 5 and 8.

The first substrate 1 and the second substrate 2 are stacked on each other as can be seen in FIG. 1B. Thereby the first connection elements 5 are attached to the second connection elements 8. Subsequently the first substrate 1 and/or the second substrate 2 are thinned, for example, by grinding. In the embodiment illustrated in FIG. 1C only the thickness of the second substrate 2 is reduced.

It may be provided that the first substrate 1 is a semiconductor wafer or a part of a semiconductor wafer which contains a plurality of integrated circuits and which has not been singulated into individual semiconductor chips yet. Furthermore, the second substrate 2 may be a semiconductor chip which has been singulated from a semiconductor wafer. This embodiment is illustrated in FIG. 2A where a part of a semiconductor wafer 1 and two semiconductor chips 2 are illustrated.

Figure 2B:
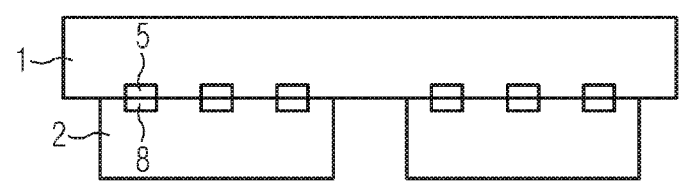
Figure 2C:
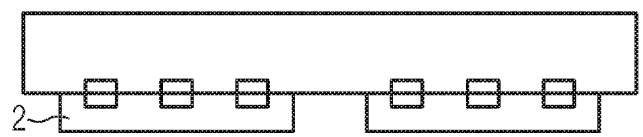
Figure 2D:
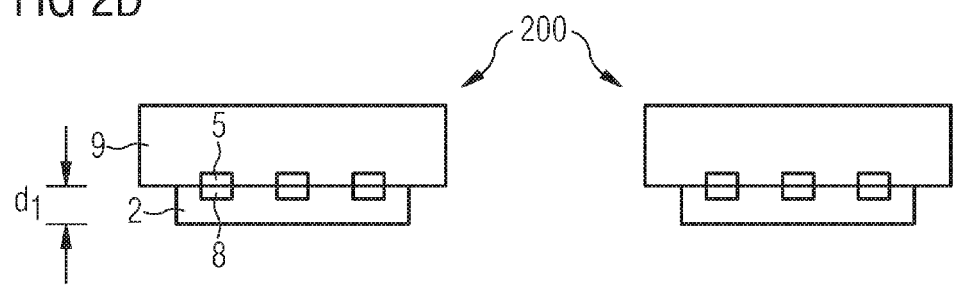

The semiconductor chips 2 are mounted on the semiconductor wafer 1 in a flip-chip manner such that the first connection elements 5 of the semiconductor wafer 1 are attached to the second connection elements 8 of the semiconductor chips 2 (see FIG. 2B). Thereafter the semiconductor chips 2 are thinned (see FIG. 2C), and the semiconductor wafer 1 is diced thereby separating individual devices 200.

Each of the devices 200 includes a first semiconductor chip 9, which has previously been in the wafer bond of the semiconductor wafer 1, and a second semiconductor chip 2. The connection elements 5 and 8 of both semiconductor chips 2 and 9 are attached to each other. Furthermore, the second semiconductor chip 2 may have a thickness $d_1$ of less than 100 µm and in one embodiment less than 50 µm. The first semiconductor chip 9 may have a thickness of more than 200 µm.

According to a further embodiment, the first substrate 1 does not solely contain semiconductor material, but contains other materials as well. The first substrate 1 may, for example, include a layer of mold material, in which semiconductor chips are embedded.

Figure 3A:
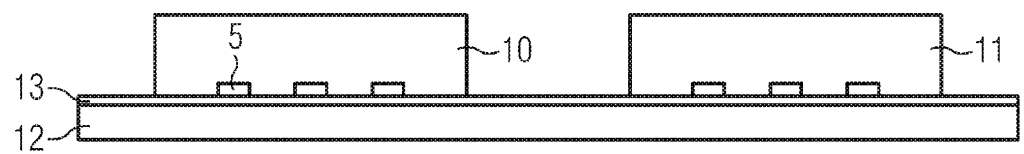
FIGS. 3A to 3F schematically illustrate a method to produce devices 300 as a further exemplary embodiment.

As illustrated in FIG. 3A, semiconductor chips 10 and 11 as well as possibly further semiconductor chips are placed over a carrier 12. The carrier 12 may be a plate made of a rigid material, for example, a metal, such as nickel, steel or stainless steel, laminate, film or a material stack. The carrier 12 has a flat surface on which the semiconductor chips 10 and 11 are placed. The shape of the carrier 12 is not limited to any geometric shape, for example, the carrier 12 may be round or square-shaped. Furthermore, the carrier 12 may have any size and any suitable array of semiconductor chips may be placed on the carrier 12 (only two of the semiconductor chips are illustrated in FIG. 3A).

The semiconductor chips 10 and 11 may have been fabricated on a wafer made of semiconductor material. After dicing the semiconductor wafer and thereby separating the individual semiconductor chips 10 and 11, the semiconductor chips 10 and 11 are relocated on the carrier 12 in larger spacing as they have been in the wafer bond. The semiconductor chips 10 and 11 may have been manufactured on the same wafer, but may have been manufactured on different wafers. Furthermore, the semiconductor chips 10 and 11 may be physically identical, but may also contain different integrated circuits. Each of the semiconductor chips 10 and 11 has connection elements 5 on one main surface and may be arranged over the carrier 12 with its connection elements 5 facing the carrier 12.

Before the semiconductor chips 10 and 11 are placed over the carrier 12, an adhesive tape 13, for example, a double sided sticky tape, may be laminated onto the carrier 12. The semiconductor chips 10 and 11 can be fixed on the adhesive tape 13. For attaching the semiconductor chips 10 and 11 to the carrier 12, other kinds of attaching materials may be used.

Figure 3B:
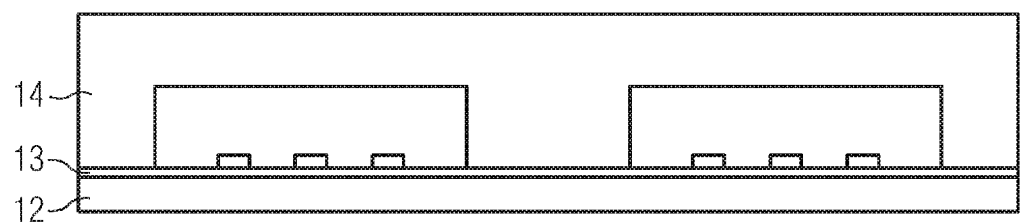

After the semiconductor chips 10 and 11 have been mounted on the carrier 12, they are encapsulated by, for example, molding using a duroplastic or thermosetting mold material 14 thereby forming a layer of mold material (see FIG. 3B). The gaps between the semiconductor chips 10 and 11 are also filled with the mold material 14. The mold material 14 may be based on an epoxy material and may contain a filling material consisting of small particles of glass ($SiO_2$) or other electrically insulating mineral filler materials like $Al_2O_3$ or organic filler materials. The thickness of the layer of the mold material 14 may be in the range from 300 to 1500 µm.

Figure 3C:
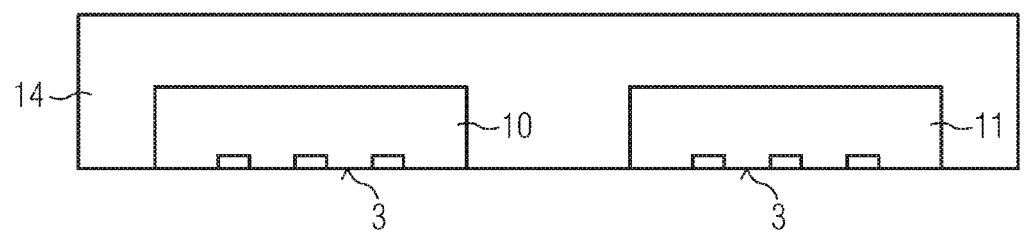

The semiconductor chips 10 and 11 covered with the mold material 14 are released from the carrier 12, and the adhesive tape 13 is pealed from the semiconductor chips 10 and 11 as well as from the mold material 14 (see FIG. 3C). The adhesive tape 13 may feature thermo-release properties, which allow the removal of the adhesive tape 13 during a heat-treatment. The removal of the adhesive tape 13 is carried out at an appropriate temperature, which depends on the thermo-release properties of the adhesive tape 13 and is usually higher than 150° C.

Figure 3D:
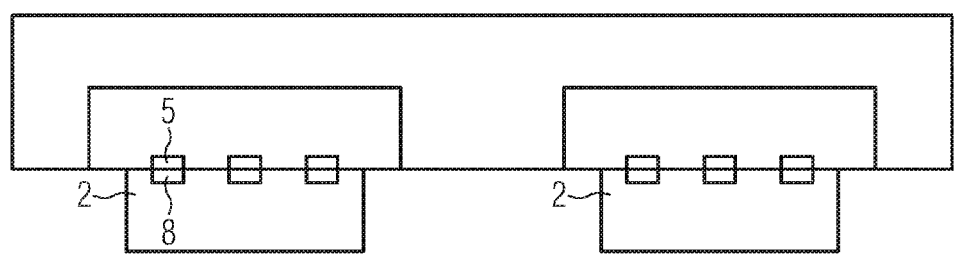
Figure 3E:
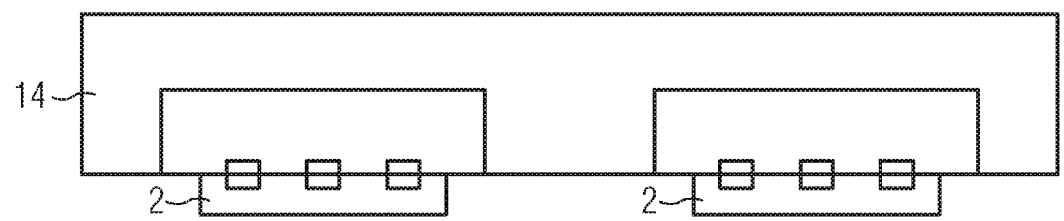
Figure 3F:
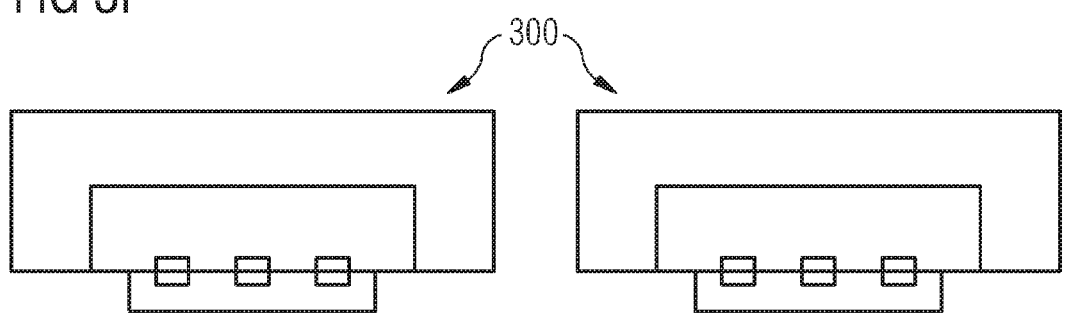

After the release of the carrier 12 and the adhesive tape 13, the active main surfaces 3 of the semiconductor chips 10 and 11 are exposed so that the connection elements 8 of the semiconductor chips 2 can be attached to the connection elements 5 of the semiconductor chips 10 and 11 (see FIG. 3D). Thereafter the semiconductor chips 2 are thinned (see FIG. 3E), and the devices 300 are singulated by dividing the mold material 14 (see FIG. 3F).

Figure 4A:
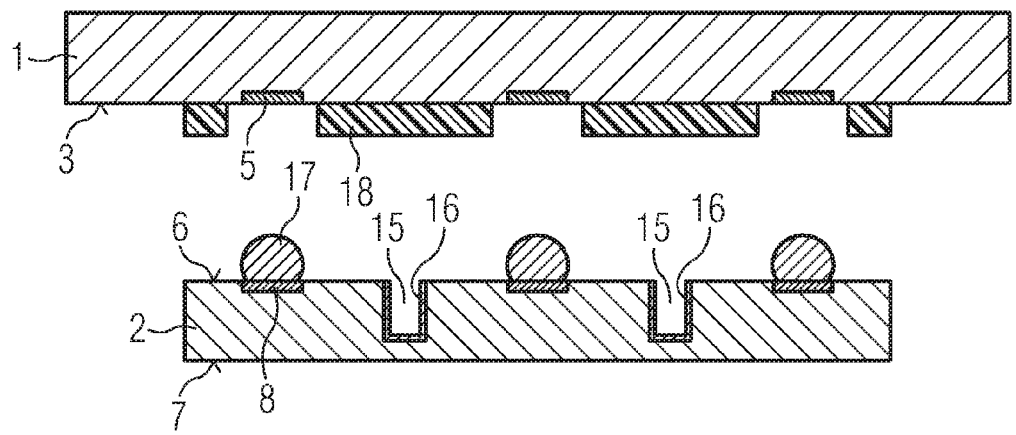
FIGS. 4A to 4H schematically illustrate a method to produce a device 400 as a further exemplary embodiment.
Figure 4B:
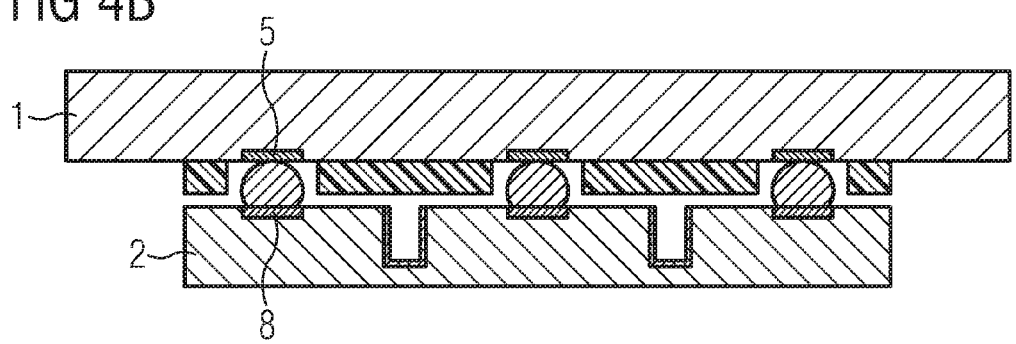
Figure 4C:
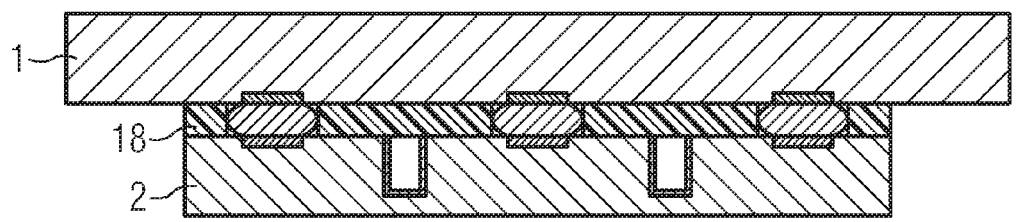
Figure 4D:
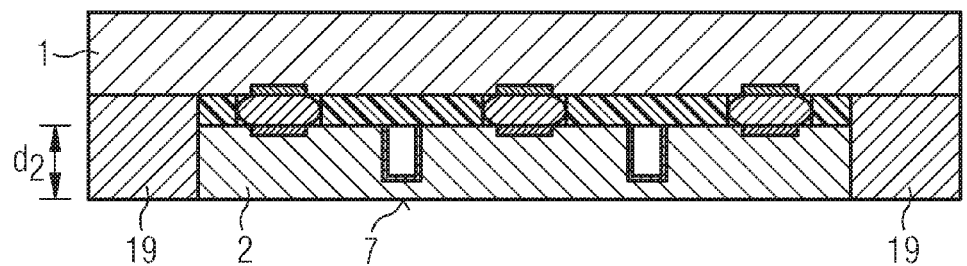
Figure 4E:
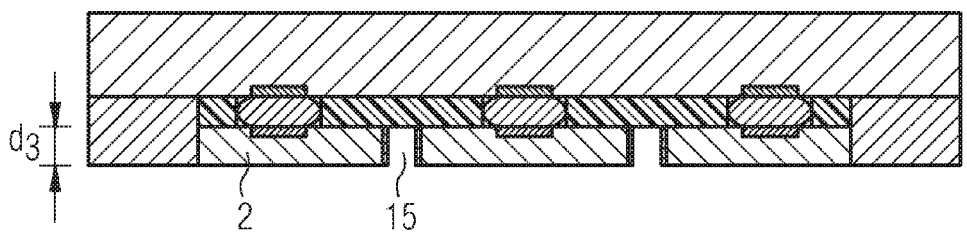
Figure 4F:
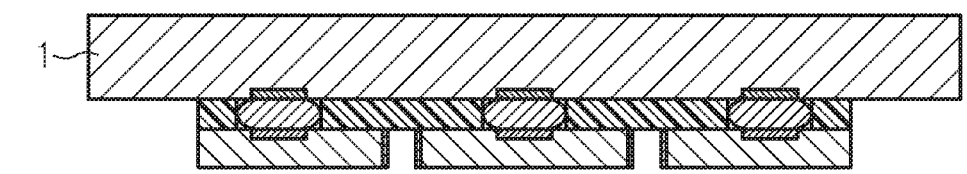
Figure 4G:
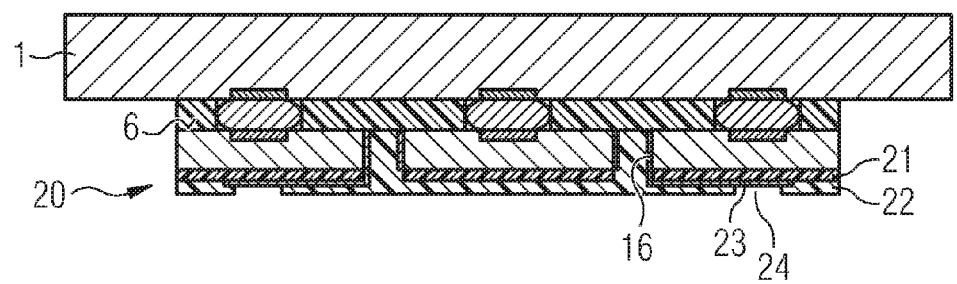
Figure 4H:
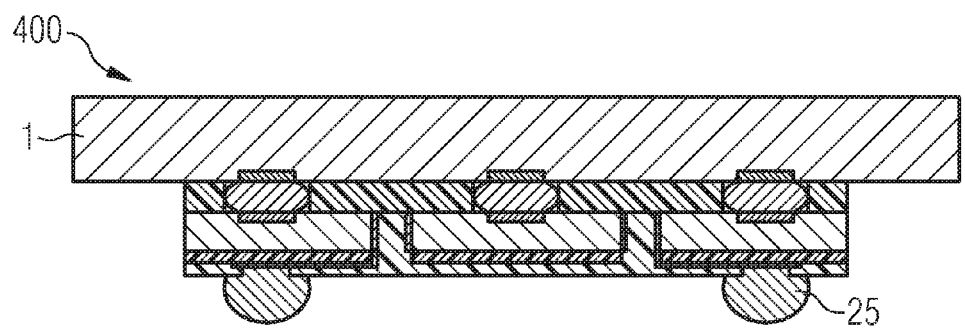

In FIGS. 4A to 4H different stages of the fabrication of a device 400, which is illustrated in cross section in FIG. 4H, are exemplarily illustrated. The device 400 is an implementation of the devices 100, 200 and 300 illustrated in FIGS. 1 to 3. The details of the fabrication method as well as the features of the device 400 that are described below can therefore be likewise applied to the devices 100, 200 and 300.

In FIG. 4A, the substrate 1 is illustrated, which may be an individual semiconductor chip or a semiconductor wafer as illustrated in FIG. 2A or a part of a semiconductor wafer or a layer of mold material, in which semiconductor chips are embedded, as illustrated in FIG. 3C. Furthermore, the substrate 1 may contain other materials and other active or passive components which can be electrically contacted via the connection elements 5, which have the form of contact pads in the present embodiment.

In FIG. 4A, the semiconductor chip 2, which is to be mounted on the substrate 1, is also illustrated. Blind holes 15 may be formed in the semiconductor chip 2. The blind holes 15 may extend from the first main surface 6 into the semiconductor material. The production of the blind holes 15 can be effected in many different ways. Electrochemical etching constitutes one possible production variant. In order to prepare for the electrochemical etching, the main surface 6 of the semiconductor chip 2 is incipiently etched selectively with respect to a mask using, for example, a potassium hydroxide solution. Afterwards the main surface 6 is covered with an electrolyte, for example, HF acid, and a voltage is applied between the second main surface 7 and the electrolyte. The main surface 7 is simultaneously irradiated by using a light source, for example, with a wavelength of 800 nm. The intensity of the light source is set such that a predetermined current density, for example, 10 nA per blind hole 15, flows between the semiconductor chip 2 and the electrolyte. As a result of the current between the incipiently etched main surface 6 and the electrolyte, pores form at the incipiently etched locations, which grow into the semiconductor chip 2 and form the blind holes 15. The form, diameter, depth and density of the produced blind holes 15 depend greatly on the current density, doping of the semiconductor chip 2, acid strength and etching time and accordingly have to be determined anew for each new application.

Instead of the electrochemical etching, other etching techniques can also be employed for the production of the blind holes 15. In principle, etching methods known in micromechanics, such as RIE (reactive ion etching) methods, laser drilling, sandblasting or ultrasonic drilling, can be used for this purpose.

The blind holes 15 may reach up to several hundred μm into the semiconductor chip 2. The widths of the blind holes 15 may be in the range from 50 to 200 μm. The blind holes 15 may be spaced apart from each other in the range from 100 to 600 μm, but other spacings are also possible.

The walls of the blind holes 15 may be coated with a layer 16 of an electrically conductive material in order to form through-connections through the semiconductor chip 2 as illustrated further below. For example, a seed layer, which may consist of palladium or metal complexes, is first deposited onto the surfaces of the blind holes 15. Then a layer of copper may be electroless deposited onto the seed layer. This copper layer may have a thickness of less than 1 μm. Afterwards another layer of copper is galvanically deposited, which may have a thickness of more than 5 μm. The electroless copper deposition may also be omitted. In one embodiment, the electrically conductive material may be sputtered onto the surfaces of the blind holes 15. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of for example, more than 5 μm.

It may be provided that an electrically insulating material, such as epoxy, is filled into the blind holes 15 coated with the electrically conductive layers 16. The electrically insulating material may protect the electrically conductive layers 16 against corrosion.

In one embodiment, it may be provided that the blind holes 15 are completely filled with an electrically conductive material, for example, copper or any other metal or metal alloy.

The main surface 6 of the semiconductor chip 2 may be an active main surface. The connection elements 8 situated on the main surface 6 may have the form of contact pads. In order to establish electrical connections between the substrate 1 and the semiconductor chip 2, solder deposits 17 may be arranged on the connection elements 8. The solder deposits 17 may, for example, be solder balls having a diameter in the range between 30 and 80 μm. The solder material may be formed from metal alloys which are composed, for example, from the following materials: SnPb, SnAg, SnAgCu, SnAgCuNi, SnAu, SnCu and SnBi.

As can be seen in FIG. 4B, the substrate 1 and the semiconductor chip 2 are arranged such that the array of the connection elements 5 and the array of the connection elements 8 are positioned on top of each other. Afterwards reflow soldering is applied to melt the solder deposits 17 and to join the surfaces of the respective connection elements 5 and 8 together (see FIG. 4C). The reflow soldering is carried out at an appropriate temperature, which is usually higher than 150° C. and may, for example, be in the range from 200° C. to 280° C.

It may be provided that before the reflow soldering process an electrically insulating layer 18 is deposited onto the surface 3 of the substrate 1 (see FIG. 4A). The electrically insulating layer 18 may be deposited as a film, foil or sheet or from a solution or a gas phase and may contain for example, reactive resins, which optionally include filler materials, novolak, polyimides, epoxides, acrylates and/or mixtures of these substances. A plurality of cutouts or through-holes may be created in the electrically insulating layer 18 to expose the connection elements 5 of the substrate 1. After its deposition the electrically insulating layer 18 may be only partly hardened and may feature adhesive properties. During the reflow soldering process the electrically insulating layer 18 may be completely hardened. When the electrically insulating layer 18 is entirely hardened, the substrate 1 and the semiconductor chip 2 are firmly attached to each other.

Instead of reflow soldering, other techniques may be utilized to electrically connect the connection elements 5 to the connection elements 8. For example, the electrical connections may be produced by diffusion soldering or adhesive bonding by using an electrically conductive adhesive.

If diffusion soldering is used as a connecting technique, it is possible to use solder materials which lead to intermetallic phases after the end of the soldering operation at the interface between the connection elements 5 and the connection elements 8 on account of interface diffusion processes. In this case, the use of AuSn, AgSn, CuSn, AgIn, AuIn or CuIn solders is conceivable. If the semiconductor chip 2 is adhesively bonded to the substrate 1, it is possible to use conductive adhesives which may be based on epoxy resins and be enriched with gold, silver, nickel or copper in order to produce the electrical conductivity.

As illustrated in FIG. 4D, the side surfaces of the semiconductor chip 2 may be covered with a mold material 19. If several semiconductor chips 2 are mounted on the substrate 1, the gaps between the individual semiconductor chips 2 may be filled with the mold material 19.

The semiconductor chip 2 is then thinned (see FIG. 4E). Grinding machines may be used that are similar or identical to the machines used for semiconductor wafer grinding. In one embodiment, etching may be used to reduce the thickness of the semiconductor chip 2. During the thinning of the semiconductor chip 2, the thickness of the layer of mold material 19 is also reduced. Furthermore, if a plurality of semiconductor chips 2 is mounted on the substrate 1, these semiconductor chips 2 may be thinned simultaneously. After the grinding a damage etching process may be performed to remove transition and crack zones caused by grinding. Alternatively or additionally to the damage etching, a chemical mechanical polishing process may be carried out.

As an effect of the thinning the bottom sides of the blind holes 15 may be opened thus creating through-holes within the semiconductor chip 2. The electrically conductive layers 16 coating the walls of the created through-holes 15 can now be accessed from the bottom side of the semiconductor chip 2. In case the blind holes 15 were completely filled with an electrically conductive material, these plugs can also be contacted from the bottom side of the semiconductor chip 2.

Before the thinning, the semiconductor chip 2 may have a thickness $d_2$ of several hundred micrometers, for example, in the range between 700 and 800 µm. After the thinning, the semiconductor chip 2 (and the further semiconductor chips mounted on the substrate 1) may have a thickness $d_3$ of less than 200 µm or less than 100 µm or less than 50 µm.

After the thinning of the semiconductor chip 2, the mold material 19 may be removed using an appropriate solvent (see FIG. 4F). In one embodiment, the mold material 19 may also be left on the substrate 1.

As illustrated in FIG. 4G, a redistribution layer 20 may be applied to the surface of the semiconductor chip 2, which has previously been thinned. In the present embodiment, the redistribution layer 20 includes two dielectric layers 21 and 22 as well as an electrically conductive layer 23 in the form of a wiring layer. The dielectric layer 21 is deposited on the planar surface of the semiconductor chip 2 formed after the thinning. The wiring layer 23 is applied to the dielectric layer 21, with electrical contacts being produced between the electrically conductive layers 16 coating the walls of the through-holes 15 and the wiring layer 23. The dielectric layer 21 has openings in order to produce these contacts.

The dielectric layer 22 is subsequently applied to the dielectric layer 21 and the wiring layer 23. The dielectric layer 22 is opened in areas where contact pads 24 are arranged. The contact pads 24 may be used to electrically couple the semiconductor chip 2 to other components. Instead of one wiring layer, it is also possible to use more than one wiring layer if required.

The dielectric layers 21 and 22 may be fabricated in various ways. For example, the dielectric layers 21 and 22 can be deposited from a gas phase or from a solution, or can be laminated onto the semiconductor chip 2. Furthermore, thin-film technology methods can be used for application of the dielectric layers 21 and 22. Each of the dielectric layers 21 and 22 may be up to 10 µm thick. In order to make electrical contacts with the wiring layer 23, the dielectric layers 21 and 22 may, for example, be opened by using photolithographic methods and/or etching methods. The wiring layer 23 may, for example, be fabricated by using metallization followed by structuring of the metallization layer in order to form the conductor tracks of the wiring layer 23.

The wiring layer 23 may also be generated galvanically. For that, usually a seed layer, for example, a palladium layer, is deposited first, which may be carried out electroless or by using an ink jet printing technique. The seed layer can then be used as an electrode for the galvanic deposition of a further electrically conductive layer. Furthermore, the wiring layer 23 and the electrically conductive layers 16 of the through-holes 15 may be generated at the same time.

The electrically conductive layers 16 allow the active main surface 6 of the semiconductor chip 2 to be electrically contacted from the opposite main surface 7 of the semiconductor chip 2 where the redistribution layer 20 is located.

Subsequently, solder deposits 25 may be placed onto the contact pads 24 of the redistribution layer 20. The solder deposits 25 may be applied to the redistribution layer 20 by "ball placement", in which pre-shaped balls 25 composed of solder material are applied to the external contact pads 24. As an alternative to "ball placement", the solder deposits 25 may, for example, be applied by using stencil printing with a solder paste, followed by a heat-treatment process. The solder deposits 25 may be used to electrically couple the device 400 to other components, for example, a PCB (Printed Circuit Board).

If several semiconductor chips 2 were mounted on the substrate 1, the devices 400 are separated from one another by separation of the substrate 1, for example, by sawing or a laser beam.

The manufacturing method illustrated in FIGS. 4A to 4H may ensure that the semiconductor chip 2 is not bent or twisted during the thinning. The reason is that the semiconductor chip 2 is first mounted on the substrate 1 in a flip-chip manner and is then thinned. Furthermore, the thinning of the semiconductor chip 2 results in a reduced overall thickness of the device 400. This makes it possible to use the device 400 for applications where reduced dimensions are required.

Figure 5:
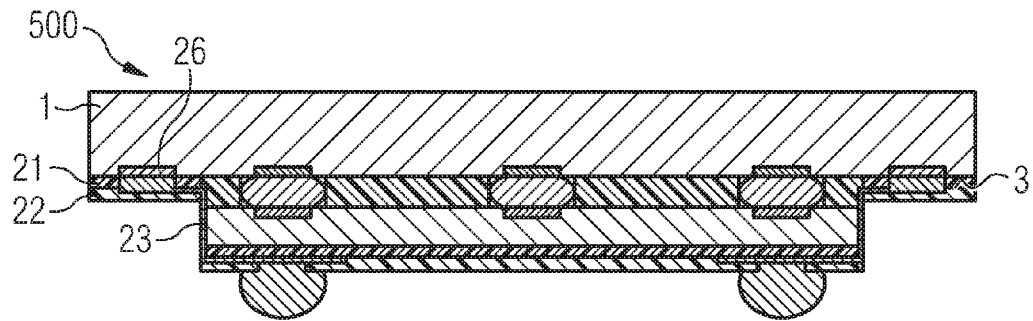
FIG. 5 schematically illustrate a device 500 as a further exemplary embodiment.

It is obvious to a person skilled in the art that the device 400 illustrated in FIG. 4H is only intended to be an exemplary embodiment, and many variations are possible. For example, further semiconductor chips or electrical components may be included into the device 400 and may, for example, be arranged between the semiconductor chip 2 and the substrate 1. Furthermore, it may be provided that the through-connections through the semiconductor chip 2 are omitted. In this case, the wiring layer 23 may extend to the surface 3 of the substrate 1 via the side surfaces of the semiconductor chip 2 as illustrated in FIG. 5. The substrate 1 of the device 500 illustrated in FIG. 5 has connection elements 26 on its surface 3, which are not covered by the semiconductor chip 2 and which are electrically connected to the wiring layer 23.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
a first semiconductor chip having an array of first connection elements on a first surface of the first semiconductor chip; and
a second semiconductor chip having an array of second connection elements on a first surface of the second semiconductor chip, wherein the first connection elements are attached to the second connection elements and the second semiconductor chip has a thickness of less than 100 µm,
the second semiconductor chip has a second surface opposite to the first surface of the second semiconductor chip and a first electrically conductive layer is applied to the second surface of the second semiconductor chip,
external contact pads are formed from the first electrically conductive layer,
the first semiconductor chip extends beyond a periphery of the second semiconductor chip,
a second electrically conductive layer is applied to at least one side surface of the second semiconductor chip and the second electrically conductive layer electrically couples at least one of the first connection elements to the first electrically conductive layer, and
the at least one of the first connection elements is located outside of the periphery of the second semiconductor chip.

2. The device of claim 1, comprising wherein the first electrically conductive layer forms a redistribution layer.

3. The device of claim 1, comprising wherein a first dielectric layer is arranged between the second surface of the second semiconductor chip and the first electrically conductive layer.

4. The device of claim 1, comprising wherein a second dielectric layer covers the first electrically conductive layer.

5. The device of claim 4, comprising wherein the second dielectric layer is opened in areas where the external contact pads are arranged.

6. The device of claim 5, comprising wherein solder deposits are placed on the external contact pads.

7. The device of claim 1, comprising wherein the first semiconductor chip and the second semiconductor chip are arranged such that each of the first connection elements is positioned on top of a respective one of the second connection elements.

8. The device of claim 1, comprising wherein solder material joins each of the first connection elements to a respective one of the second connection elements.

9. The device of claim 8, comprising wherein an electrically insulating layer is arranged at the space between the first semiconductor chip and the second semiconductor chip where no solder material is positioned.

10. The device of claim 1, wherein the second semiconductor chip comprises at least one through-connection.

11. The device of claim 10, wherein the at least one through-connection comprises a through-hole extending through the second semiconductor chip and an electrically conductive material coating a wall of the through-hole.

12. The device of claim 11, comprising wherein an electrically insulating material is filled into the through-hole.

13. The device of claim 11, wherein the first electrically conductive layer is electrically coupled to the electrically conductive material coating the wall of the through-hole.

14. The device of claim 1, comprising wherein the first semiconductor chip has a thickness of more than 200 µm.

15. The device of claim 1, comprising wherein mold material covers at least one side surface of the second semiconductor chip.

16. The device of claim 15, comprising wherein the mold material has a surface that is flush with the second surface of the second semiconductor chip.

17. The device of claim 1, comprising wherein the first semiconductor chip is encapsulated with a mold material.

18. The device of claim 17, comprising wherein the first surface of the first semiconductor chip is flush with a surface of the mold material.

* * * * *